(12) United States Patent
Kaufman et al.

(10) Patent No.: US 6,322,313 B1
(45) Date of Patent: Nov. 27, 2001

(54) APPARATUS AND METHOD FOR INSERTING A WAFER, SUBSTRATE OR OTHER ARTICLE INTO A PROCESS MODULE

(75) Inventors: Robert Kaufman, Canoga Park; Gary C. Downes, Moorpark, both of CA (US)

(73) Assignee: Technic Inc., Cranston, RI (US)

( * ) Notice: Subject to any disclaimer, the term of this patent is extended or adjusted under 35 U.S.C. 154(b) by 0 days.

(21) Appl. No.: 09/611,303

(22) Filed: Jul. 6, 2000

Related U.S. Application Data
(60) Provisional application No. 60/142,731, filed on Jul. 8, 1999.

(51) Int. Cl.[7] .................................................. B65G 1/133
(52) U.S. Cl. ...................... 414/749.1; 414/800; 414/808; 414/810; 52/118
(58) Field of Search ................................ 414/749.1, 718, 414/728, 800, 808, 810; 901/21, 24; 52/118

(56) References Cited

U.S. PATENT DOCUMENTS

| | | | |
|---|---|---|---|
| 4,417,845 | * | 11/1983 | Burton ............................ 414/733 X |
| 4,643,627 | | 2/1987 | Bednorz et al. . |
| 5,178,512 | | 1/1993 | Skrobak . |
| 5,882,172 | * | 3/1999 | Kawai et al. ........................ 414/749 |
| 6,051,101 | * | 4/2000 | Ohtani et al. ..................... 156/345 X |

FOREIGN PATENT DOCUMENTS

| | | | | |
|---|---|---|---|---|
| 37 17957 A1 | * | 12/1988 | (DE) .............................. B65G/47/90 |
| 0 291 292 A2 | * | 11/1988 | (EP) ............................... F16H/21/44 |
| 1495125 | | 7/1989 | (RU) . |

* cited by examiner

Primary Examiner—Christopher P. Ellis
Assistant Examiner—Kenneth W Bower
(74) Attorney, Agent, or Firm—Blakely, Sokoloff, Taylor & Zafman LLP (57) ABSTRACT

An apparatus and method for inserting and removing a wafer into and from a plating apparatus, includes an elongated primary arm having a wafer seat for supporting the wafer, an elongated secondary arm for supporting the primary arm, and a mounting surface for supporting the secondary arm. The apparatus further includes a drive band mechanically coupled to the primary arm for causing the movement thereof. The drive band includes a portion wound around a drum that is driven by a motor. The motor, in rotating the drum, causes the drive band to move the primary arm along an axis between a retracted position wherein the primary arm, the secondary arm, and the mounting surface are in a stacked relationship, and an extended position wherein the secondary arm protrudes from the mounting surface along the axis, and the primary arm protrudes from the secondary arm along the axis.

40 Claims, 5 Drawing Sheets

APPARATUS AND METHOD FOR INSERTING A WAFER, SUBSTRATE OR OTHER ARTICLE INTO A PROCESS MODULE

CROSS REFERENCE TO A RELATED PATENT APPLICATION

This patent application claims as priority of the filing date of Provisional Patent Application Ser. No. 60/142,731 filed on Jul. 8, 1999, and entitled "Apparatus and Method for Inserting a Wafer, Substrate or Other Articles into a Process Module", which is incorporated herein by reference.

FIELD OF THE INVENTION

This invention relates generally to an apparatus and method for inserting a wafer, substrate or other article into a process module, and specifically, to an apparatus and method for inserting a wafer into a process module that provides a telescoping loading arm having a relatively long extension while requiring a relatively small footprint.

BACKGROUND OF THE INVENTION

A semiconductor wafer electroplating apparatus typically performs a wafer plating process within an enclosed and self-contained environment. One reason for this is to prevent contaminants from entering a wafer electroplating apparatus and adversely affecting the plating process. Another reason is typically toxic/corrosive fluids and gasses are involved in the plating process and containing them within an enclosed and self-contained environment is an environmental and safety requirement. Yet another reason for an enclosed and self-contained environment is to achieve a better control of the quantity, pressure, volume and other parameters of the fluids and gasses involved in the plating process.

Because of the enclosed and self-contained environment of a wafer electroplating apparatus, a wafer needs to be inserted into the plating apparatus to set the wafer at the plating process staging area. In many cases, plating apparatuses or other process modules are relatively large in size because they have to house electronics, mechanical parts, tubing, internal chambers, sumps, and other components. Accordingly, often a wafer needs to travel a long distance from outside of the process module into the process staging area of the module. Because of the relatively light weight characteristic of wafer, the transporting of the wafer into and from a process module should be performed with substantial control to avoid dislocation of the wafer from its appropriate position. Thus, there is a need for a system and method of transporting a wafer, substrate, or other articles into and out of a process module with substantial control, even though the wafer may travel a relatively long distance.

Another problem with inserting a wafer, substrate or other article into a plating apparatus or other process module arises from the need or desire to reduce the size of these machines. Since clean room real estate is a valuable commodity, there is a need to make efficient use of space. Thus, the sizes of plating apparatuses and other process modules have been substantially reduced in recent years. Because these process modules often house a substantial amount of components, process modules are becoming more crowded internally with components. As a result, it is sometimes difficult to insert a wafer, substrate or other article into a process module because of a relatively small clearance requirement. Thus, there is a need for a system and method of transporting a wafer, substrate, or other article into and out of a process module that has a relatively low profile (thickness) to allow an article to be inserted within a relatively small clearance.

Yet another problem with inserting a wafer, substrate or other article into a plating apparatus or other process module arises from the relatively high precision requirement in placing a wafer into a process staging area. A process staging area for a wafer electroplating apparatus includes cathode contacts that electrically connect to the top surface of the wafer, typically at very precise locations. Often, wafer electroplating apparatus include alignment mechanism so that the wafer is precisely placed in the process staging area. However, typically the wafer has to be transported within an alignment zone for the alignment mechanism to work properly. This still may require a relatively high level of precision, especially given the long distance the wafer has to travel from outside to the inside of the process module. Thus, there is a need for a system and method of transporting a wafer, substrate, or other article into and out of a process module with substantial precision.

In summary, there is a need for a system and method of transporting a wafer, substrate, or other article into and out of a process module that (1) has substantial control in inserting an article into a process module even though the article has to travel a relatively long distance, that (2) has a relatively low profile (thickness) to allow an article to be inserted within a relatively small clearance, and that (3) has substantial precision in placing of the article. Such a system and method is provided herein in accordance with the invention.

SUMMARY OF THE INVENTION

An aspect of the invention includes an apparatus for inserting and removing a wafer into and from a plating apparatus, comprising an elongated primary arm including a wafer seat for supporting the wafer, an elongated secondary arm for supporting the primary arm, and a mounting surface for supporting the secondary arm. The apparatus further includes a drive band mechanically coupled to the primary arm for causing the movement thereof. The drive band includes a portion wound around a drum that is driven by a motor. The motor causes the drive band to move the primary arm along an axis between a retracted position wherein the primary arm, the secondary arm, and the mounting surface are in a stacked relationship, and an extended position wherein the secondary arm protrudes from the mounting surface along the axis, and the primary arm protrudes from the secondary arm along the axis.

The drive band is preferably made out of stainless steel and has a concaveshaped cross-section for providing improved strength and rigidity during the extensions of the primary and secondary arms. The motor, which is preferably a stepper motor, provides substantial control in extending and retracting the primary and secondary arms. The mounting surface includes horizontally-oriented opposing rollers for guiding the movement of the secondary arm along the axis, and the secondary arm likewise includes horizontally-oriented opposing rollers for guiding the movement of the primary arm arm along the axis. Both the primary and secondary arm are comprised of a relatively thin plate, and this feature in combination with the horizontally-oriented rollers, gives the apparatus a low-profile characteristic to allow the wafer to be inserted within a relatively small clearance.

Another aspect of the invention includes a method of inserting and removing an article into a process staging area of a process module using an apparatus that includes a primary arm having a seat supporting the article, a secondary arm that supports the primary arm, and a mounting surface that supports the secondary arm. The method comprises a first step of moving the primary arm along an axis from a retracted position to a first intermediate position. In the retracted position, the primary arm, the secondary arm, and the mounting surface are in a stacked relationship. Also in this position, the article seated on the primary arm remains outside of the process staging area. In the first intermediate position, the secondary arm and the mounting surface are in a stacked relationship and the primary arm protrudes from the secondary arm along the axis.

The second step is moving the primary and secondary arms together along the axis from the first intermediate position to an extended position. In the extended position, the secondary arm protrudes from the mounting surface along the axis and the primary arm protrudes from the secondary arm along the axis. Also in this position, the article is now proximate the process staging area. The third step is moving the primary arm along the axis from the extended position to a second intermediate position. In the second intermediate position, the primary arm and the secondary arm are in a stack relationship, but both protrude from the mouting surface along the axis. The final step is moving the primary and secondary arms together along the axis from the second intermediate position to the retracted position wherein the article is again outside of the process staging area.

In summary, the apparatus and method is characterized by having an extension arm that has a low profile (thickness), is light weight, and has strength and rigidity when it is extended to provide a controlled insertion of the article into the process module. Although the insertion of a wafer is used to illustrate the invention, it shall be understood that other articles, including substrates can also be inserted into a process module in accordance with the invention.

Other aspects, features, and techniques of the invention become apparent in view of the following detailed discussion of the invention.

DETAILED DESCRIPTION OF THE INVENTION

Referring to FIGS. 1–5, a wafer inserting apparatus 100 in accordance with the invention is shown. The wafer inserting apparatus 100 comprises a primary arm 102 for supporting a wafer to be inserted into a process module (not shown). The primary arm 102 is mechanically coupled to a secondary arm 104 for extending the primary arm 102, and mechanically coupled to a drive band 106 for extending and retracting the primary and secondary arms 102 and 104. The drive band 106 includes a portion that is coiled around a drum 108 that is rotatably driven by a stepper motor 110. The stepper motor 110 is mounted to an L-shaped bracket 113 that is, in turn, mounted on a mounting plate 112.

The wafer inserting apparatus 100 also comprises a pneumatic cylinder 114 for raising and lowering the primary arm 102. The pneumatic cylinder 114 is mounted to the underside of the mounting plate 112 and to a fixed mounting base 116 which is, in turn, mounted to a second fixed horizontal mounting plate 118. The wafer inserting apparatus 100 also includes a guide cylinder/shaft 120 for guiding the vertical movement and providing lateral restraint of the mounting plate 112 as it is vertically positioned by the pneumatic cylinder 114. The horizontal mounting plate 118 is mechanically coupled to a fixed vertical plate 122 which is, in turn, coupled to an additional fixed vertical plate 124 used for securely mounting to the process module. The wafer inserting apparatus 100 further includes a cover 126 for enclosing the stepper motor 110, the pneumatic cylinder 114 and the guide cylinder 120.

In more detail, the primary arm 102 comprises a thin plate 130 preferably formed of stainless steel. A wafer seat 132 is mounted on the thin plate 130 by suitable attachment means, such as screws 133. In the preferred embodiment, the wafer seat 132 is formed of polypropylene material or other suitable plastic material. The wafer seat 132 includes a pair of ledges 134 situated on opposing sides of the wafer seat 132 for wafer alignment purpose and to keep the wafer situated on the wafer seat 132 during movement of the primary arm 102.

The primary arm 102 is connected to the drive band 106 by suitable attachment means, such as screw 136. The primary arm 102 further includes a contact surface 138 that makes contact with a contact pin 154 mounted on the secondary arm 104 when the primary arm 102 is retracted. This action causes the secondary arm 104 to retract when the primary arm 102 is retracted, as will be explained in more detail later. The primary arm 102 also includes at least one contact extension 140 (preferably two) that makes contact with rollers 152 mounted on the secondary arm 104 when the primary arm 102 is extended. This action causes the secondary arm 104 to extend when the primary arm 102 is extended, as will be explained in more detail later. The thin plate 130 may include one or more holes 142 to reduce the weight thereof. The thin plate 130 also includes a track 144 throughout its opposing edges to serve as a track for guiding the movement of the primary arm 102. In the preferred embodiment, the track 144 is configured into a v-groove.

The secondary arm also comprises a thin plate 150 preferably formed of stainless steel. The thin plate 150 includes a plurality of rollers 152, preferably four, horizontally mounted thereon. The rollers 152 mates with the track 144 of the primary arm 102 for guiding the sliding movement thereof. The rear rollers 152 of the secondary arm 104 makes contact with the contact extension 140 when the primary arm 102 is fully extended, to cause the extension of the secondary arm 104. The secondary arm 104 further includes a contact pin 154 to make contact with the contact surface 138 of the primary arm 102 when it is retracted, in order to retract the secondary arm 104. The secondary arm 104 also includes a contact extension 155 to make contact with horizontally-mounted rollers 159 on the mounting plate 112 when it is extended, in order to stop the secondary arm 104 from further extending. Additionally, the secondary arm 104 includes a contact surface 157 which makes contact with a contact pin 161 on the mounting plate 112 when the secondary arm 104 is fully retracted.

The thin plate 150 of the secondary arm 104 may include one or more holes 156 to reduce the weight thereof. In addition, the thin plate 150 includes a track 158 throughout its opposing edges to serve as a track for guiding the movement of the secondary arm 104. In the preferred embodiment, the track is configured into v-groove track which mates with the horizontally-mounted rollers 159 on the mounting plate 112.

The drive band 106 is formed of a pliable material, preferably of stainless steel. The drive band 106 has a concave downward cross-section to improve the strength and rigidity of the band during its extension. An end of the drive band 106 is attached to the primary arm 102 by suitable attachment means, such as screw 136. From that end, the drive band 106 extends rearward to a 90-degree guide 160 and then downward to the drum 108, where it is coiled around and attached thereto. The 90-degree guide 160 is mounted on the top side of the mounting plate 112.

Figure 1A:
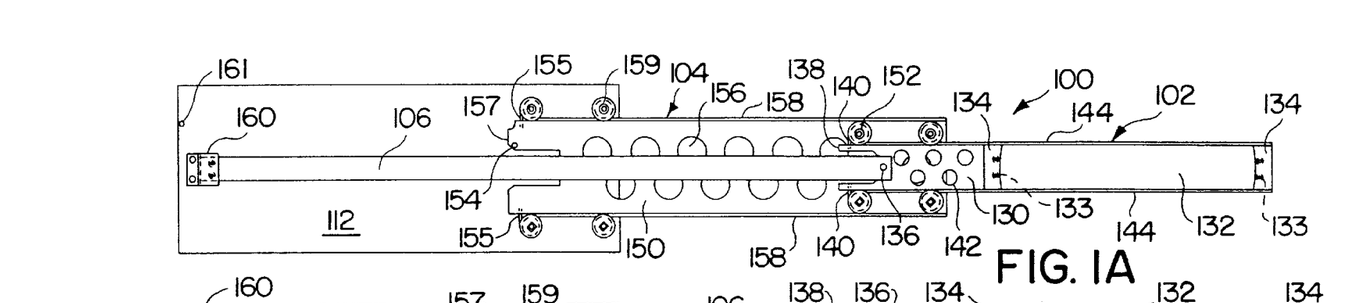
FIGS. 1A and 1B illustrate top and side views of a wafer inserting apparatus in accordance with the invention.
Figure 1B:
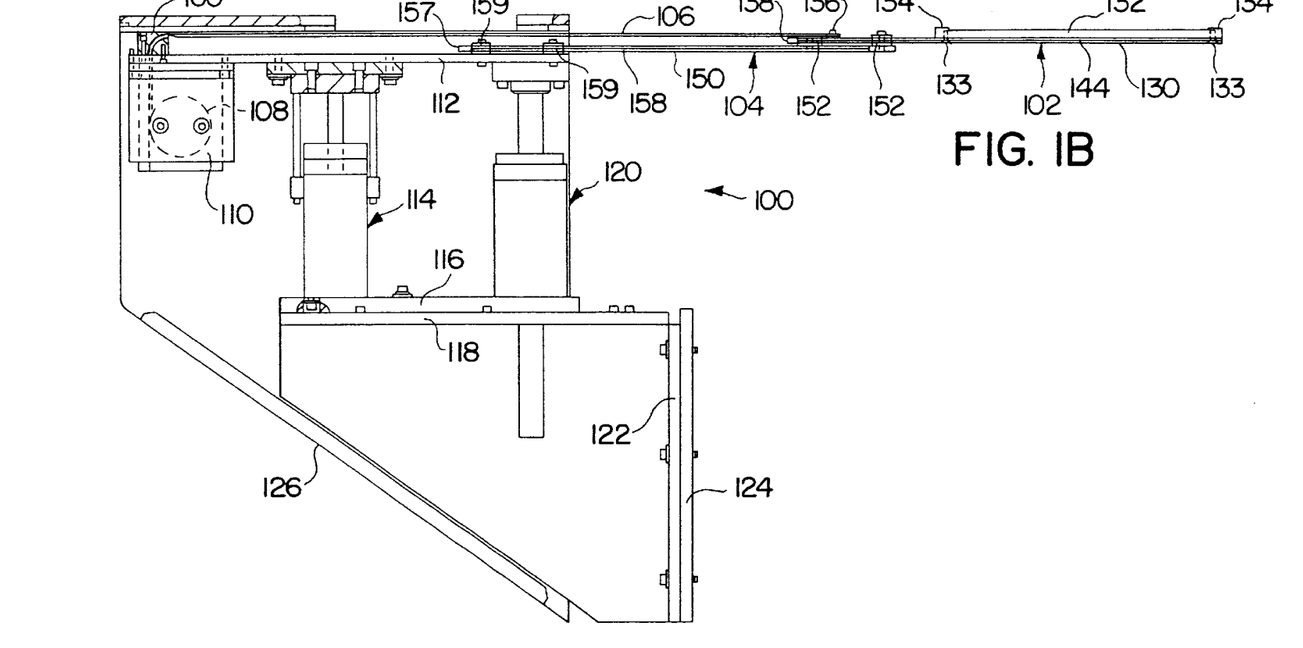
Figure 2:
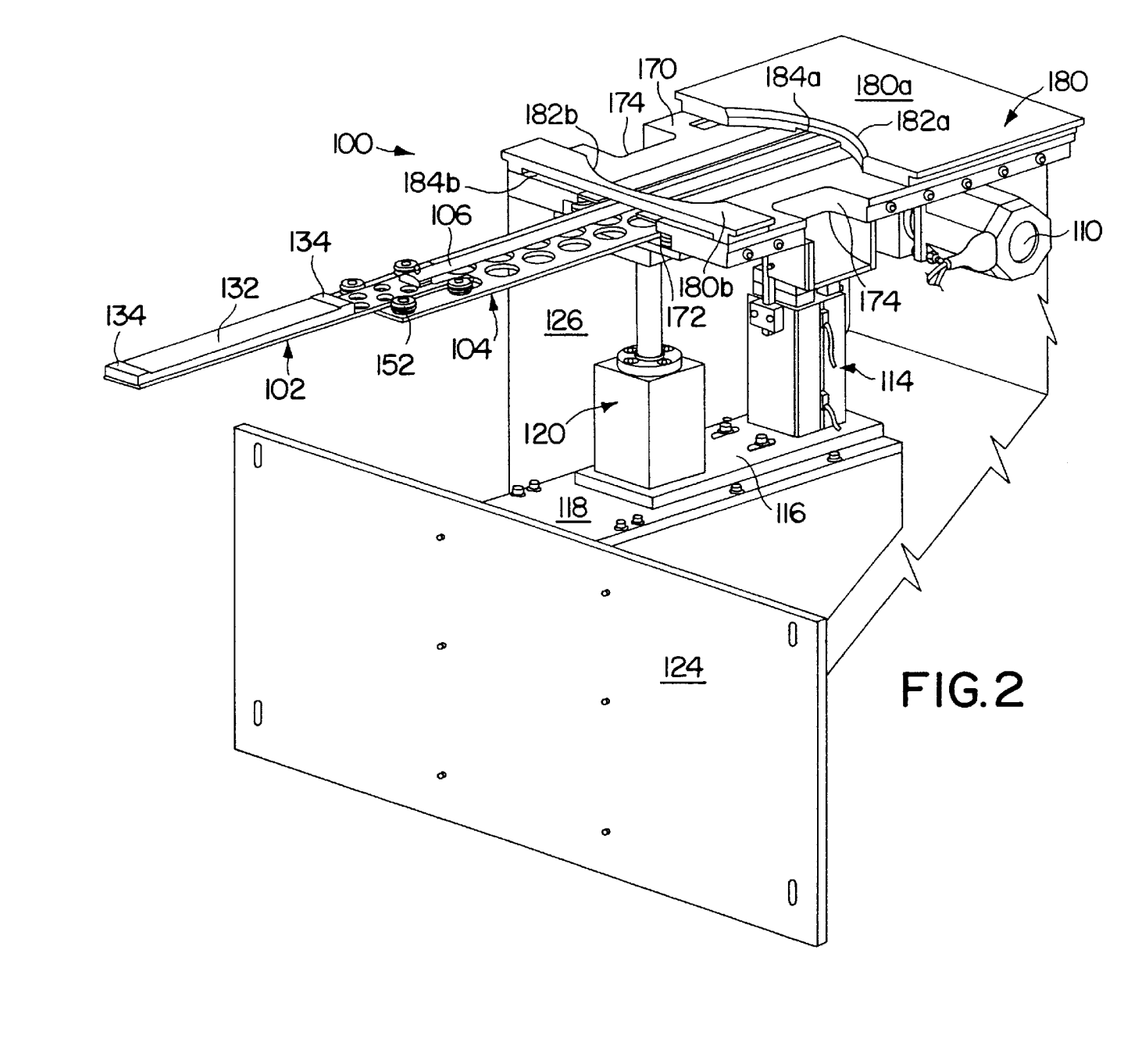
FIG. 2 illustrates a perspective view of the wafer inserting apparatus in accordance with the invention.
Figure 3:
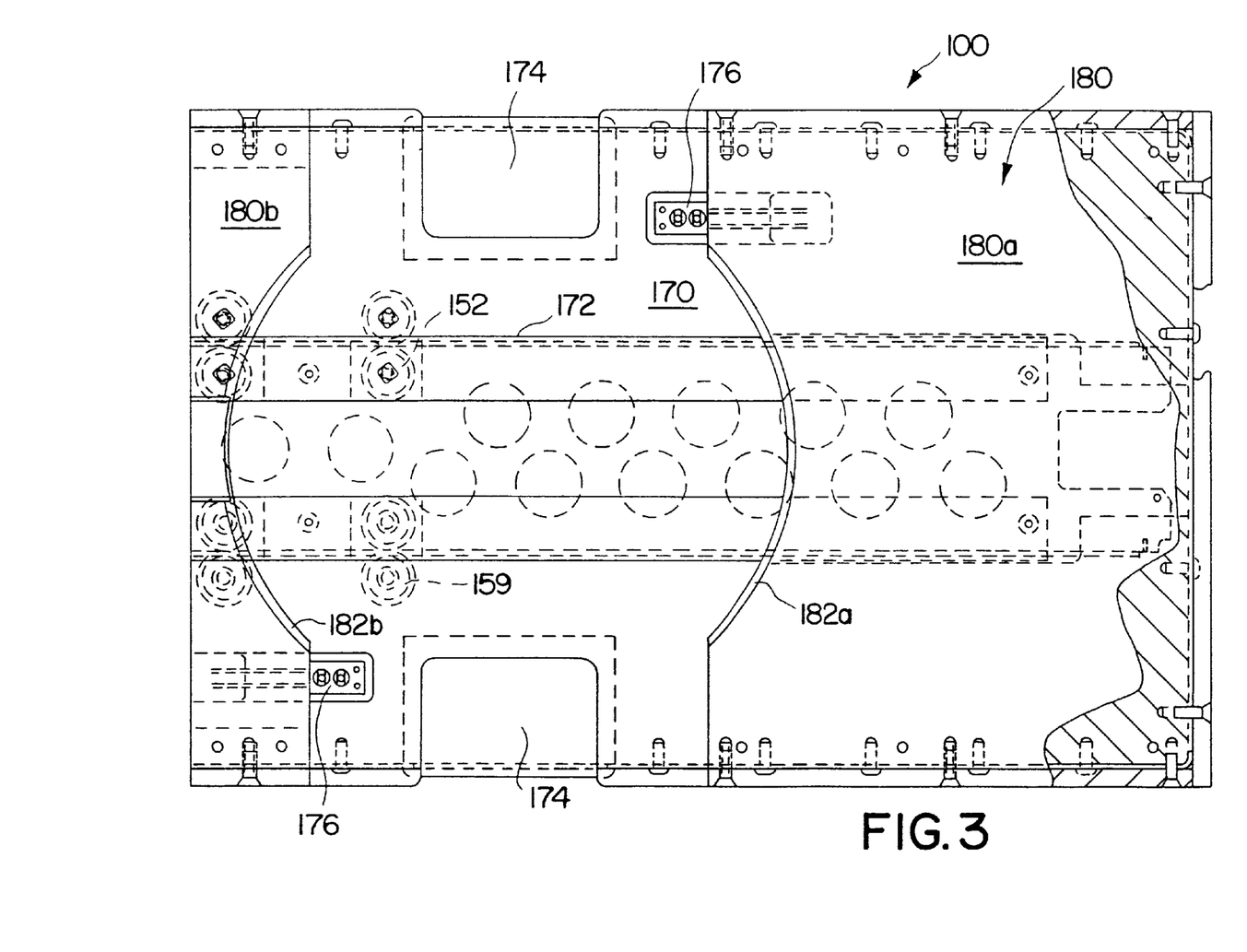
FIG. 3 illustrates a top view of the wafer inserting apparatus in its fully retracted position in accordance with the invention.
Figure 4:
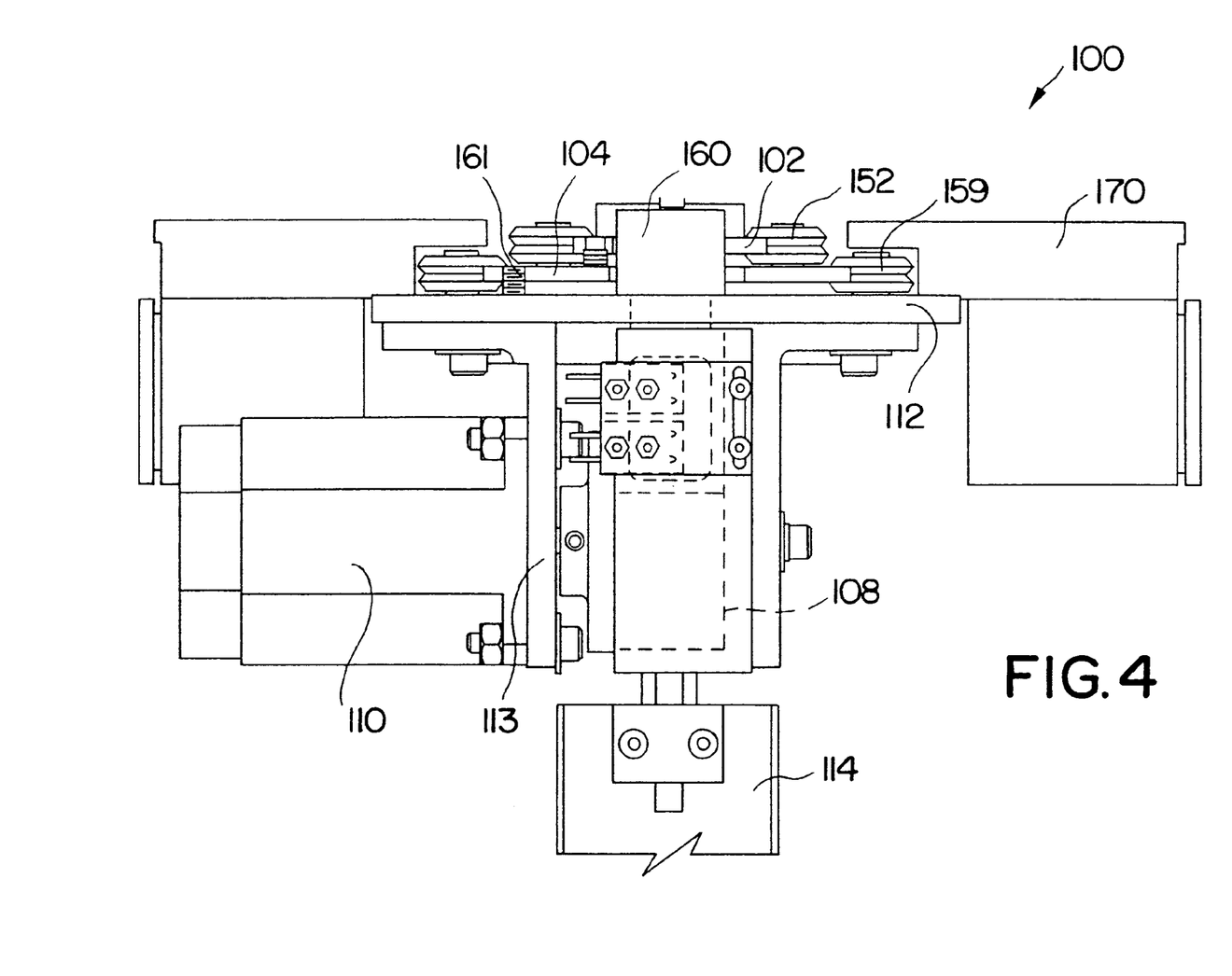
FIG. 4 illustrates a front view of a portion of the wafer inserting apparatus in accordance with the invention.
Figure 5:
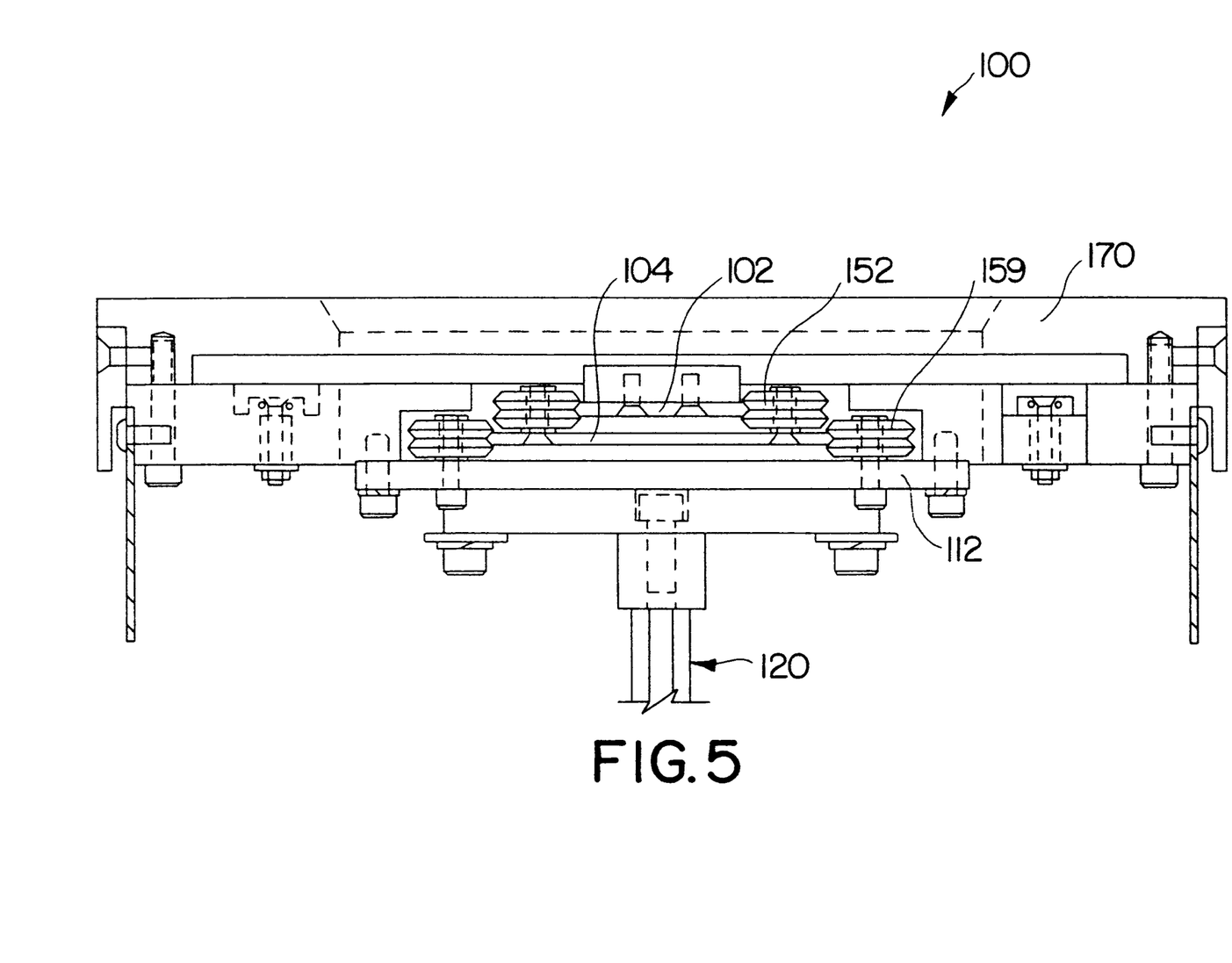
FIG. 5 illustrates a rear view of a portion of the wafer inserting apparatus in accordance with the invention.

Referring specifically to FIGS. 2–3, the wafer inserting apparatus 100 further includes a platform 170 on which the wafer is placed before it is inserted into the process module. The platform 170 includes a slot 172 extending from the front to the rear of the apparatus 100 for housing the base plate rollers 159, secondary arm 104 including its rollers 152, primary arm 102 including the wafer seat 132, and the drive band 106. The platform 170 also includes a pair of opposing grooves 174 for providing clearances to the underside of the wafer for a wafer holding device, such as a pair of tweezers or a wand with suction cups. An optical sensor 176 may be mounted on the platform 170 to sense the presence of a wafer and relay that information to a controller (not shown). The controller prevents the extension of the arms 102 and 104 when there is no wafer sensed by the optical sensor 176.

The wafer inserting apparatus 100 further includes a top cover 180 mounted to the platform 170. The top cover 180 is preferably configured into a rear section 180a and a front section 180b. The front and rear sections 180a–b of the top cover 180 includes opposing curved sides 182a–b which outlines a portion of the perimeter of a wafer when seated on the platform 170, and is used to assist in properly positioning the wafer on the wafer seat 132. The rear section 180a of the top cover 180 includes a rear slot 184a situated between the top cover 180 and the mounting plate 112 to provide spacing for the band drive 106 and the 90-degree guide 160. The front section 180b of the top cover 180 also includes a much wider front slot 184b situated between the top cover 180 and the platform 170 to provide spacing for the band drive 106, the wafer seat 132, and the wafer.

In operation, prior to inserting the wafer into the process module, the wafer inserting apparatus 100 is configured in a manner that both the primary and secondary arms 102 and 104 are in their fully retracted positions. This position is shown in FIG. 3. The wafer is then positioned within the wafer alignment curved sides 182a–b of the top cover and seated on the wafer seat 132. The stepper motor 110 is then actuated to cause the drive band 106 to move in a forward direction, thereby extending the primary arm 102. During the extension of the primary arm 102, its contact extension 140 makes contact with the rear rollers 152 of the secondary arm 104 and forces the secondary arm 104 to extend with the primary arm 102. The stepper motor 110 continues to be actuated until the secondary arm 104 is fully extended by having its contact extension 155 make contact with the rear rollers 159.

During the retraction of the primary and secondary arms 102 and 104, the stepper motor 110 is actuated to cause the drive band 106 to move in a rearward direction, thereby retracting the primary arm 102. During the retraction of the primary arm 102, its contact surface 138 makes contact with the contact pin 154 of the secondary arm 104, and thereby causes the retraction of the secondary arm 104 along with the primary arm 102. The stepper motor 110 continues to be actuated until the contact surface 157 of the secondary arm 104 makes contact with the contact pin 161 of the mounting plate 112.

During the extension and retraction of the primary and secondary arms 102 and 104, it may be necessary to vertically position the primary arm 102 properly within the process module. To do so, the pneumatic actuator 114 may be actuated to position the primary arm 102 to a desired vertical position. The shaft/cylinder 120 guides the vertical movement of the mounting plate 112 and laterally restraints it.

The wafer inserting apparatus 100 and corresponding methods achieves a relatively long extension with the use of the primary and secondary arms 102 and 104 as well as their drive band for causing their extensions. The wafer inserting apparatus 100 and corresponding methods also achieves a relatively small footprint to implement since the primary and secondary arms 102 and 104 overlie each other when they are fully retracted (See FIG. 3). Additionally, the wafer inserting apparatus 100 and corresponding methods provides extension arms 102 and 104 that have a low profile (thickness) due to the relatively flat configuration of the arms 102 and 104 and the drive band 106, as well as the horizontally-mounted rollers 152 and 159. In addition, the arms 102 and 104 are light weight due to the plurality of holes 142 and 158. Furthermore, the arms 102 and 104 and the drive band 106 have strength and rigidity during its extension due to its stainless steel composition, as well as the concave downward cross-section of the drive band 106.

Although a stepper motor 110 is used to drive the drive band 106, it shall be understood that other types of motors can be used, including direct current (DC) motors, alternating current (AC) motors, synchronous motors, asynchronous motors, and so on. The particular type of motor used to drive the drive band 106 is not critical to the invention. Also, although the pneumatic cylinder 114 is used to position the primary arm 102 to a desired vertical position, it shall be understood that other devices, such as an electric motor can be used to cause the vertical movement of the primary arm 102. Furthermore, the primary and secondary arms 102 and 104, and the drive band 106 can be made out of other material other than stainless steel, as long as it provides strength and rigidity during their extension.

The foregoing description of the exemplary embodiments of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description.

It is claimed:

1. An apparatus for inserting a wafer into a plating apparatus, comprising:

an elongated primary arm including a wafer seat for supporting said wafer, an elongated secondary arm for supporting said primary arm;

a mounting surface for supporting said elongated secondary arm;

a drum;

a drive band including a portion thereof wound around said drum, wherein said drive band is mechanically coupled to said elongated primary arm; and a motor for rotating said drum to cause said drive band to move said primary arm along an axis between a retracted position wherein said primary arm, said secondary arm, and said mounting surface are in a stacked relationship, and an extended position wherein said secondary arm protrudes from said mounting surface along said axis, and said primary arm protrudes from said secondary arm along said axis, wherein said primary arm makes contact with said secondary arm at an intermediate position between said retracted position and said extended position wherein said secondary arm and said mounting surface are in a stacked relationship and said primary arm protrudes from said secondary arm along said axis, said primary arm being in contact with said secondary arm causes said secondary arm to protrude from said mounting surface when said primary arm is moved from said intermediate position to said extended position.

2. The apparatus of claim 1, further including a pneumatic cylinder for raising and lowering said mounting surface along with said primary and secondary arms.

3. The apparatus of claim 2, further including a guide shaft for guiding said raising and lowering of said mounting surface along with said primary and secondary arms.

4. The apparatus of claim 1, further including a motor for raising and lowering said mounting surface along with said primary and secondary arms.

5. The apparatus of claim 1, wherein said drive band includes a concave cross-section to provide improve strength and ridigity when said drive band is in said extended position.

6. The apparatus of claim 1, wherein said mounting surface includes horizontally-mounted opposing rollers for guiding the movement of said secondary arm along said axis, and wherein said secondary arm includes horizontally-mounted opposing rollers for guiding the movement of said primary arm along said axis.

7. An apparatus for inserting a wafer into a plating apparatus, comprising:
   an elongated primary arm including a wafer seat for supporting said wafer;
   an elongated secondary arm for supporting said primary arm;
   a mounting surface for supporting said elongated secondary arm;
   a drum;
   a drive band including a portion thereof wound around said drum, wherein said drive band is mechanically coupled to said elongated primary arm; and
   a motor for rotating said drum to cause said drive band to move said primary arm along an axis between a retracted position wherein said primary arm, said secondary arm, and said mounting surface are in a stacked relationship, and an extended position wherein said secondary arm protrudes from said mounting surface along said axis, and said primary arm protrudes from said secondary arm along said axis, wherein said primary arm makes contact with said secondary arm at an intermediate position between said retracted position and said extended position wherein said secondary arm and said primary arm are in said stacked relationship both of which protrude from said mounting surface along said axis, said primary arm being in contact with said secondary arm causes said secondary arm to move into a stacked relationship with said mounting surface when said primary arm is moved from said intermediate position to said retracted position.

8. The apparatus of claim 7, further including a pneumatic cylinder for raising and lowering said mounting surface along with said primary and secondary arms.

9. The apparatus of claim 8, further including a guide shaft for guiding said raising and lowering of said mounting surface along with said primary and secondary arms.

10. The apparatus of claim 7, further including a motor for raising and lowering said mounting surface along with said primary and secondary arms.

11. The apparatus of claim 7, wherein said drive band includes a concave cross-section to provide improve strength and ridigity when said drive band is in said extended position.

12. The apparatus of claim 7, wherein said mounting surface includes horizontally-mounted opposing rollers for guiding the movement of said secondary arm along said axis, and wherein said secondary arm includes horizontally-mounted opposing rollers for guiding the movement of said primary arm along said axis.

13. A method of inserting and removing an article proximate a process staging area of a process module using an apparatus that includes a primary arm having a seat supporting said article, a secondary arm that supports said primary arm, and a mounting surface that supports said secondary arm, comprising:
   moving said primary arm along an axis from a retracted position wherein said primary arm, said secondary arm, and said mounting surface are in a stacked relationship and said article is outside of said process staging area, to a first intermediate position wherein said secondary arm and said mounting surface are a said stacked relationship and said primary arm protrudes from said secondary arm along said axis, wherein said secondary arm remains stationary while said primary arm moves from said retracted position to said first intermediate position;
   moving said primary and secondary arms together along said axis from said first intermediate position to an extended position whereat said secondary arm protrudes from said mounting surface along said axis and said primary arm protrudes from said secondary arm along said axis, and wherein said article is proximate said process staging area;
   moving said primary arm along said axis from said extended position to a second intermediate position wherein said primary arm and said secondary arm are in said stacked relationship, and both of which protrude from said mounting surface along said axis; and
   moving said primary and secondary arms together along said axis from said second intermediate position to said retracted position wherein said article is again outside of said process staging area.

14. The method of claim 13, wherein said moving primary arm steps include actuating a motor to cause the rotation of a drum on which a portion of a drive band is wound around, said drive band being coupled to said primary arm for moving thereof.

15. The method of claim 14, wherein said drive band includes a concave cross-section to provide improved strength and ridigity when said drive band is in said extended position.

16. The method of claim 13, further including raising or lowering said mounting surface along with said primary and secondary arms to vertically position said article.

17. The method of claim 16, wherein said raising or lowering is performed using a pneumatic actuator.

18. The method of claim 16, wherein said raising or lowering is performed using a motor.

19. The method of claim 16, further including a step of guiding said raising or lowering of said mounting surface.

20. A method of inserting and removing an article proximate a process staging area of a process module using an apparatus that includes a primary arm having a seat supporting said article, a secondary arm that supports said primary arm, and a mounting surface that supports said secondary arm, comprising:

moving said primary arm along an axis from a retracted position wherein said primary arm, said secondary arm, and said mounting surface are in a stacked relationship and said article is outside of said process staging area, to a first intermediate position wherein said secondary arm and said mounting surface are a said stacked relationship and said primary arm protrudes from said secondary arm along said axis;

moving said primary and secondary arms together along said axis from said first intermediate position to an extended position whereat said secondary arm protrudes from said mounting surface along said axis and said primary arm protrudes from said secondary arm along said axis, and wherein said article is proximate said process staging area;

moving said primary arm along said axis from said extended position to a second intermediate position wherein said primary arm and said secondary arm are in said stacked relationship, and both of which protrude from said mounting surface along said axis; and moving said primary and secondary arms together along said axis from said second intermediate position to said retracted position wherein said article is again outside of said process staging area;

wherein said first moving primary and secondary arms together comprises having said primary arm contact said secondary arm at said first intermediate position to cause said primary and secondary arms to move together.

21. A method of inserting and removing an article proximate a process staging area of a process module using an apparatus that includes a primary arm having a seat supporting said article, a secondary arm that supports said primary arm, and a mounting surface that supports said secondary arm, comprising:

moving said primary arm along an axis from a retracted position wherein said primary arm, said secondary arm, and said mounting surface are in a stacked relationship and said article is outside of said process staging area, to a first intermediate position wherein said secondary arm and said mounting surface are a said stacked relationship and said primary arm protrudes from said secondary arm along said axis;

moving said primary and secondary arms together along said axis from said first intermediate position to an extended position whereat said secondary arm protrudes from said mounting surface along said axis and said primary arm protrudes from said secondary arm along said axis, and wherein said article is proximate said process staging area;

moving said primary arm along said axis from said extended position to a second intermediate position wherein said primary arm and said secondary arm are in said stacked relationship, and both of which protrude from said mounting surface along said axis; and moving said primary and secondary arms together along said axis from said second intermediate position to said retracted position wherein said article is again outside of said process staging area;

wherein said second moving primary and secondary arms together comprises having said primary arm contact said secondary arm at said second intermediate position to cause said primary and secondary arms to move together.

22. An apparatus for inserting an article into a process module, comprising:

a primary arm including a seat for supporting said article;

a secondary arm for supporting said primary arm;

a mounting surface for supporting said secondary arm; and a motor mechanically coupled to said primary arm for causing said primary arm to move along an axis between a retracted position wherein said primary arm, said secondary arm, and mounting surface are in a stacked relationship, and an extended position wherein said secondary arm protrudes from said mounting surface along said axis and said primary arm protrudes from said secondary arm along said axis;

wherein said primary arm makes contact with said secondary arm at an intermediate position between said retracted position and said extended position wherein said secondary arm and said mounting surface are in said stacked relationship and said primary arm protrudes from said secondary arm along said axis, said primary arm being in contact with said secondary arm causes said secondary arm to protrude from said mounting surface when said primary arm is moved from said intermediate position to said extended position.

23. The apparatus of claim 22, further including a pneumatic cylinder for raising or lowering said mounting surface along with said primary and secondary arms.

24. The apparatus of claim 23, further including a guide shaft for guiding said raising or lowering of said mounting surface along with said primary and secondary arms.

25. The apparatus of claim 22, further including a motor for raising or lowering said mounting surface along with said primary and secondary arms.

26. The apparatus of claim 22, further including a drive band coupling said motor to said primary arm to cause the movement of said primary arm along said axis, wherein said drive band includes a concave cross-section to provide improve strength and ridigity when said drive band is in said extended position.

27. The apparatus of claim 22, wherein said mounting surface includes horizontally-mounted opposing rollers for guiding the movement of said secondary arm along said axis, and wherein said secondary arm includes horizontally-mounted opposing rollers for guiding the movement of said primary arm along said axis.

28. An apparatus for inserting an article into a process module, comprising: primary arm including a seat for supporting said article;

a secondary arm for supporting said primary arm;

a mounting surface for supporting said secondary arm; and a motor mechanically coupled to said primary arm for causing said primary arm to move along an axis between a retracted position wherein said primary arm, said secondary arm, and mounting surface are in a stacked relationship, and an extended position wherein said secondary arm protrudes from said mounting surface along said axis and said primary arm protrudes from said secondary arm along said axis;

wherein said primary arm makes contact with said secondary arm at an intermediate position between said retracted position and said extended position wherein said secondary arm and said primary arm are in a stacked relationship both of which protrude from said mounting surface along said axis, said primary arm being in contact with said secondary arm causes said secondary arm to move into said stacked position with said mounting surface when said primary arm is moved from said intermediate position to said retracted position.

29. The apparatus of claim 28, further including a pneumatic cylinder for raising or lowering said mounting surface along with said primary and secondary arms.

30. The apparatus of claim 29, further including a guide shaft for guiding said raising or lowering of said mounting surface along with said primary and secondary arms.

31. The apparatus of claim 28, further including a motor for raising or lowering said mounting surface along with said primary and secondary arms.

32. The apparatus of claim 28, further including a drive band coupling said motor to said primary arm to cause the movement of said primary arm along said axis, wherein said drive band includes a concave cross-section to provide improve strength and ridigity when said drive band is in said extended position.

33. The apparatus of claim 28, wherein said mounting surface includes horizontally-mounted opposing rollers for guiding the movement of said secondary arm along said axis, and wherein said secondary arm includes horizontally-mounted opposing rollers for guiding the movement of said primary arm along said axis.

34. A method of inserting and removing an article proximate a process staging area of a process module using an apparatus that includes a primary arm having a seat supporting said article, a secondary arm that supports said primary arm, and a mounting surface that supports said secondary arm, comprising:

moving said primary arm along an axis from a retracted position wherein said primary arm, said secondary arm, and said mounting surface are in a stacked relationship and said article is outside of said process staging area, to a first intermediate position wherein said secondary arm and said mounting surface are a said stacked relationship and said primary arm protrudes from said secondary arm along said axis;

moving said primary and secondary arms together along said axis from said first intermediate position to an extended position whereat said secondary arm protrudes from said mounting surface along said axis and said primary arm protrudes from said secondary arm along said axis, and wherein said article is proximate said process staging area;

moving said primary arm along said axis from said extended position to a second intermediate position wherein said primary arm and said secondary arm are in said stacked relationship, and both of which protrude from said mounting surface along said axis, wherein said secondary arm remains stationary while said primary arm moves from said extended position to said second intermediate position; and moving said primary and secondary arms together along said axis from said second intermediate position to said retracted position wherein said article is again outside of said process staging area.

35. The method of claim 34, wherein said moving primary arm steps include actuating a motor to cause the rotation of a drum on which a portion of a drive band is wound around, said drive band being coupled to said primary arm for moving thereof.

36. The method of claim 35, wherein said drive band includes a concave cross-section to provide improved strength and rigidity when said drive band is in said extended position.

37. The method of claim 34, further including raising or lowering said mounting surface along with said primary and secondary arms to vertically position said article.

38. The method of claim 37, wherein said raising or lowering is performed using a pneumatic actuator.

39. The method of claim 37, wherein said raising or lowering is performed using a motor.

40. The method of claim 37, further including a step of guiding said raising or lowering of said mounting surface.

* * * * *